(12) United States Patent
Tanabe

(10) Patent No.: US 6,486,437 B2
(45) Date of Patent: Nov. 26, 2002

(54) APPARATUS FOR TRANSFORMING SEMICONDUCTING THIN LAYER

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/746,433

(22) Filed: Dec. 21, 2000

(65) Prior Publication Data
US 2001/0052513 A1 Dec. 20, 2001

(30) Foreign Application Priority Data
Dec. 24, 1999 (JP) .......................................... 11-368095

(51) Int. Cl.$^7$ .............................................. B23K 26/12
(52) U.S. Cl. ................................ 219/121.86; 219/212.6
(58) Field of Search ....................... 219/121.86, 121.6, 219/121.78, 121.83, 121.85

(56) References Cited

U.S. PATENT DOCUMENTS 4,177,372 A * 12/1979 Kotera et al. ............ 219/121 L
5,956,581 A * 9/1999 Yamazaki et al. .......... 438/166
5,998,838 A * 12/1999 Tanabe et al. .............. 257/347

* cited by examiner

*Primary Examiner*—M. Alexandra Elve
(74) *Attorney, Agent, or Firm*—Katten Muchin Zavis Rosenman

(57) ABSTRACT

Disclosed is an apparatus for modifying a semiconducting thin layer, which has: a hermetically sealed container having a substrate mount section for mounting thereon a substrate with an amorphous semiconducting thin layer formed thereon, and a light transmissive window for introducing a laser beam; laser beam irradiation means for heat-melting the amorphous semiconducting thin layer; holding means for fixing and holding the substrate on the substrate mount section; and pressure control means which regulates the flow rate of gas fed into the hermetically sealed container to control the pressure of the atmosphere within the hermetically sealed container at the time of irradiation with the laser beam at a value above a vapor pressure specified by the temperature of the heat-melted amorphous semiconducting thin layer.

7 Claims, 15 Drawing Sheets

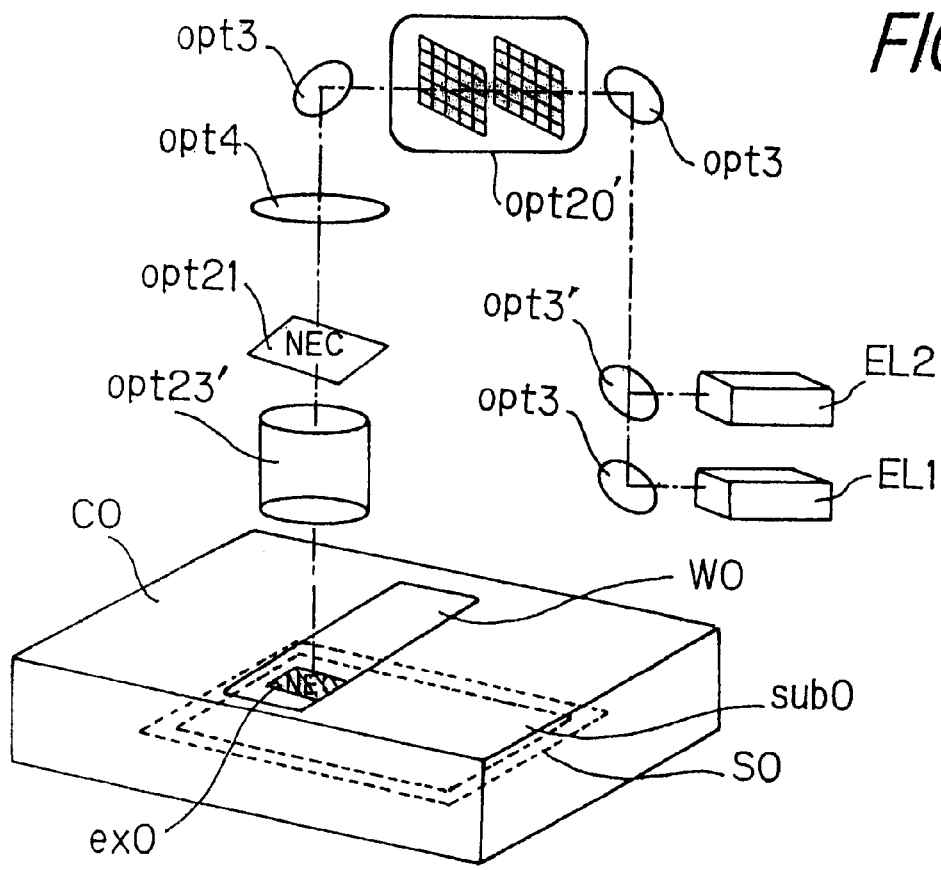
FIG.3
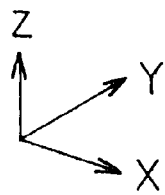
STAGE MOVEMENT DIRECTION
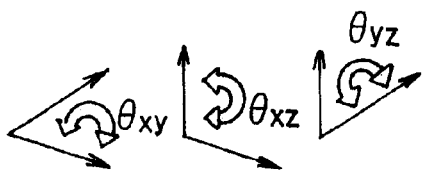
STAGE TILT DIRECTION

MASK PATTERN

EXPOSURE PATTERN

ETCHING PATTERN

FIG.6
CONTROL EXAMPLE (1)
| | | |
|---|---|---|
| OPERATION OF SUBSTRATE STAGE | on off | 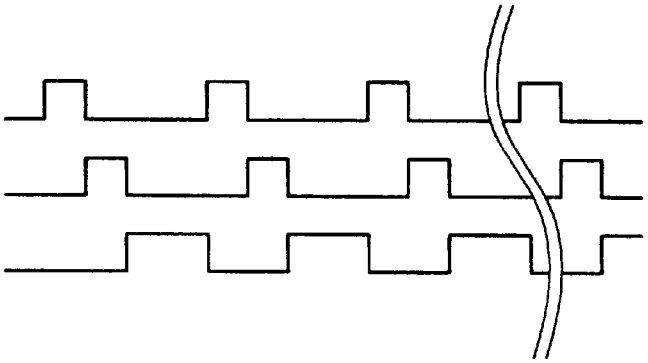 |
| POSITIONING, FOCUSING, ETC | on off | |
| IRRADIATION OF SUBSTRATE WITH LIGHT | on off | |
CONTROL EXAMPLE (2)
| | | |
|---|---|---|
| OPERATION OF SUBSTRATE STAGE | on off | 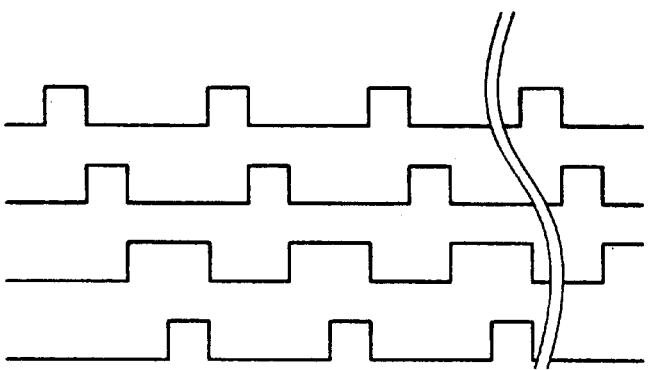 |
| POSITIONING, FOCUSING, ETC | on off | |
| OPERATION OF MASK STAGE | on off | |
| IRRADIATION OF SUBSTRATE WITH LIGHT | on off | |

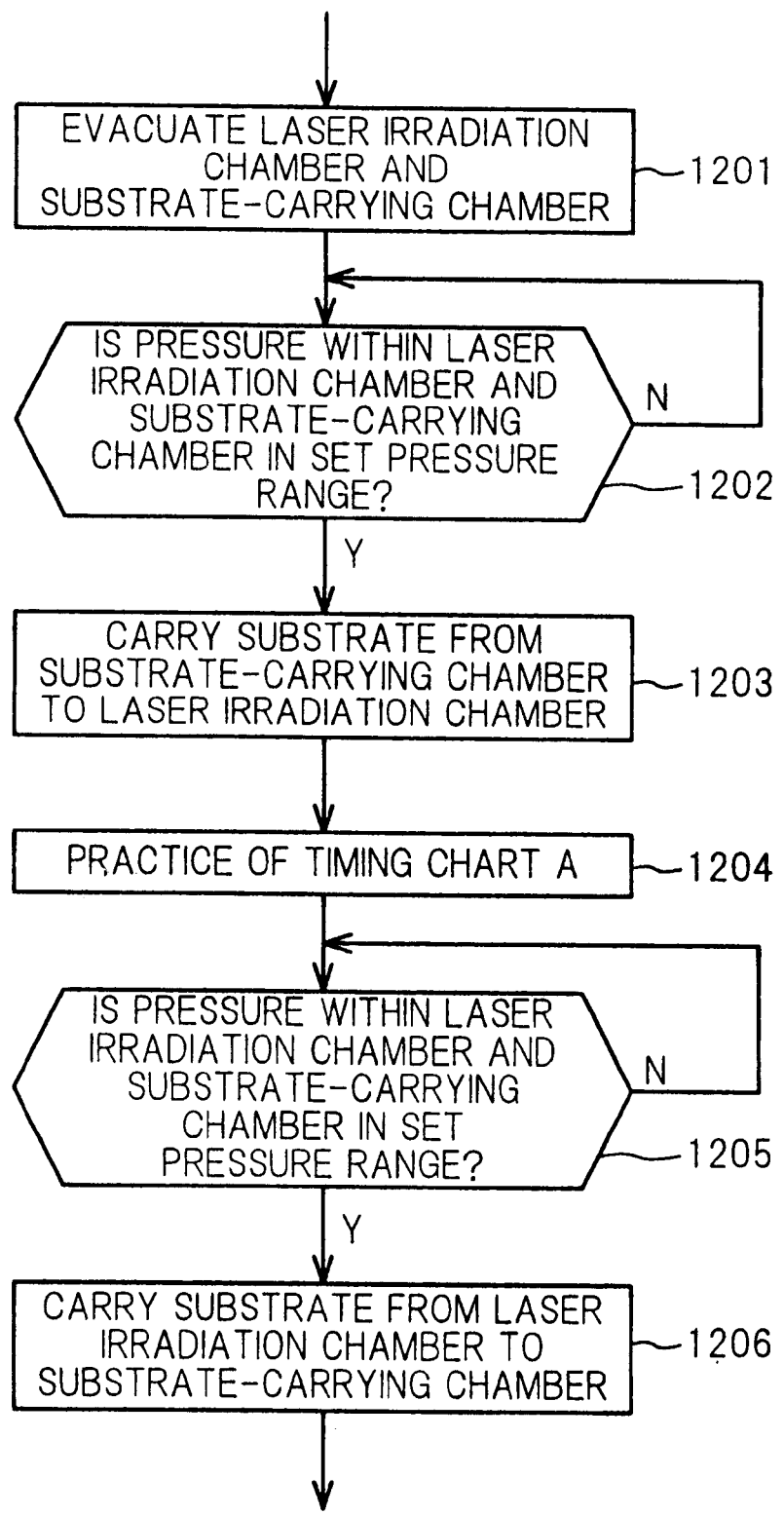

FIG.15A
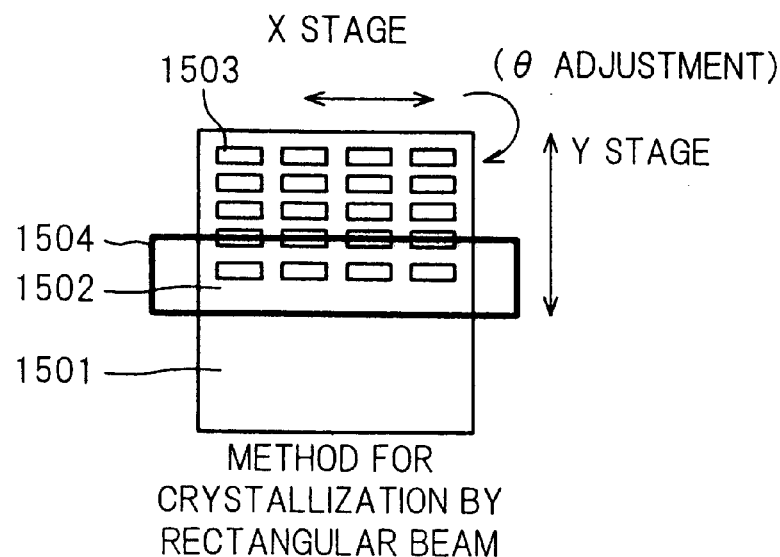
METHOD FOR
CRYSTALLIZATION BY
RECTANGULAR BEAM
FIG.15B
CONTINUOUS LASER
OSCILLATION 
-Y STAGE MOVEMENT 
LASER OSCILLATION
AND STAGE OPERATION

APPARATUS FOR TRANSFORMING SEMICONDUCTING THIN LAYER

FIELD OF THE INVENTION

The invention relates to an apparatus for transforming a semiconducting thin layer, and more particularly to an apparatus for transforming a semiconducting thin layer, utilizing a laser crystallization method (a method wherein an amorphous semiconductor material deposited on a substrate is crystallized with laser irradiation).

BACKGROUND OF THE INVENTION

Field-effect thin film transistors (TFTs) provided on a glass substrate or the like have hitherto been extensively used, for example, as driving elements for displays, sensors, and printing devices. Representative technology for forming such TFT include a hydrogenated-amorphous silicon TFT technology and a polycrystalline silicon TFT technology.

In the former method, the highest temperature of the preparation process is about 300° C., and a carrier mobility of about 1 $cm^2/Vsec$ is realized. This method is used in the production of switching transistors for each pixel in active matrix (AM-) liquid crystal displays (LCDs). AM-LCD has a driving TFT for each pixel and drives TFT of each pixel is driven by peripheral integrated circuit around the display area(IC; LSI formed on a monocrystalline silicon substrate). Since a switching TFT is provided on each pixel, as compared with passive matrix LCD wherein a liquid crystal driving electric signal is sent from a peripheral driver circuit, AM-LCD features a reduction in cross talk and the like and the realization of good image quality.

On the other hand, the latter method uses, for example, a quartz substrate, and the use of a high-temperature process similar to LSI using a temperature of about 1,000° C. can provide a performance of 30 to 100 $cm^2/Vsec$ in terms of carrier mobility. The realization of this high carrier mobility, when this method is applied, for example, to liquid crystal displays, enables pixel TFT for driving each pixel and a peripheral drive circuit section to be simultaneously formed on a single glass substrate. This can lead to advantages associated with a reduction in production process cost and a reduction in size of LCD. That is, connecting TFT to peripheral drive circuits through tab connection or wire bonding according to a prior art method is difficult to cope with a reduction in pitch of connection between the AM-LCD substrate and the peripheral driver integrated circuit due to the reduction in size of LCD and the increase in resolution. The above polycrystalline silicon TFT method has an advantage of the reduction in size, but on the other hand, when the high-temperature process is used, the inexpensive glass having a low softening point usable in the former process cannot be disadvantageously used.

For this reason, in order to solve the above problems, it is necessary to lower the temperature in the polycrystalline silicon TFT process. This has led to enthusiastic research and development of a method for polycrystalline silicon layer formation at a low temperature that has applied a laser crystallization method. For example, Japanese Patent Publication No. 118443/1995 discloses a method wherein a short-wavelength pulse laser beam is applied to crystallize a thin layer of amorphous silicon provided on an amorphous substrate and the crystallized thin layer is applied to thin film transistors. According to this method, amorphous silicon can be crystallized without raising the temperature of the whole substrate. Therefore, a semiconductor element or a semiconductor integrated circuit can be advantageously prepared on a large area substrate, such as a liquid crystal display, and an inexpensive substrate such as glass. As described in the above publication, however, an irradiation intensity of about 50 to 500 $mJ/cm^2$ is necessary for the crystallization of a thin layer of amorphous silicon by a short-wavelength laser beam.

On the other hand, the maximum light emission output in a currently generally available pulse laser device is about 1 J/pulse, and, upon simple conversion, the area over which the laser beam can be applied per single laser beam irradiation is as small as about 2 to 20 $cm^2$. Therefore, for example, a laser beam should be applied to at least 87 to 870 sites for crystallizing the whole substrate having a size of 47×37 $cm^2$ by the laser beam. When the size of the substrate is increased, for example, to 1 m square, the number of laser irradiation sites should be increased accordingly. Further, an attempt has also been made wherein a linear beam (length 100 to 300 mm, width about 1 to 0.1 mm) is used as the beam applied to the substrate and the beam is scanned in the direction of width to change the beam scanning direction from two axes (x axis and y axis) to one axis (x axis).

In general, the laser crystallization is realized by a pulsed laser irradiation device having a construction shown in FIG. 14.

FIG. 14 is an explanatory view of a conventional ELA apparatus. As shown in the drawing, a laser beam fed from a pulsed laser beam source 1401 reaches a thin layer 1407 of silicon on a glass substrate 1408 as an irradiation object through optical paths 1406 specified by a group of optical devices, such as mirrors 1402, 1403, 1405 and a beam homogenizer 1404 provided for homogenizing spatial intensity. In general, since one irradiation area range is smaller than the glass substrate, a laser beam is applied to any desired site on the substrate by moving the glass substrate 1408 on an x-y stage 1409. A construction may also be adopted wherein, instead of the use of the x-y stage 1409, the group of optical devices is moved, or alternatively the group of optical devices is used in combination with the stage.

A linear beam irradiation form having a length equal to the size of one side of the substrate is adopted, and this beam can also be applied while moving a Y stage with the substrate disposed thereon. In this case, the movement of the stage and the feed of the pulsed beam are carried out according to the following procedure.

1) Simultaneously with the movement of the stage at a given rate, a pulsed laser beam is oscillated and fed at a given cycle.
2) (Movement of the stage by one step followed by stop)+(the feed of the pulsed laser beam by one pulse) are repeated.

FIG. 15 is a diagram illustrating a conventional irradiation method in the case where the beam irradiation form is rectangular. In general, since one irradiation area range 1502 is smaller than the glass substrate, a laser beam is applied to any desired site on the substrate by moving the glass substrate 1501 on an x-y stage. A construction may also be adopted wherein, instead of the use of the x-y stage, the movement of a group of optical devices (for example, direction X) is utilized in combination with the movement of the stage (direction Y). Crystallized regions 1503 are successively formed by adopting this method. In this case, the movement of the stage and the feed of the pulsed beam are carried out according to the following procedure. Numeral 1504 designates a laser introduction window provided in the chamber.

3) Simultaneously with the movement of the stage at a given rate, the pulsed laser beam is oscillated and fed at a given cycle.

4) (Movement of the stage by one step followed by stop)+(the feed of the pulsed laser beam by not less than one pulse) are repeated.

In the laser crystallization using a linear beam or a rectangular beam, means for moving a substrate stage is utilized.

In some cases, the laser beam irradiation is carried out within a vacuum chamber in vacuum or in a high-purity gas atmosphere. If necessary, as shown in FIG. 14, a system may be adopted wherein a glass substrate-containing cassette 1410 provided with a thin layer of silicon and a substrate-carrying mechanism 1411 are provided and the taking-out and the housing of the substrate are mechanically carried out between the cassette and the stage. In the adoption of the above method, the glass substrate has been merely disposed on the xy stage, and any special means for fixing and holding the substrate on the stage has not been adopted.

In order to enhance the utilization efficiency of the laser beam, however, it is necessary to apply the laser beam to only a desired region while avoiding the application of the laser beam to a portion unnecessary to be irradiated with the laser beam (for example, a cut margin created at the time of cutting of devices), thereby reducing the number of laser beam irradiation sites and enhancing the utilization efficiency of the laser beam. To this end, the device preparation region should conform to the laser irradiation region, and the accidental shift of the substrate on the stage should be prevented. In particular, when the stage has a coordinate system and the irradiation site is controlled based on this coordinate system, the accidental shift should be avoided. Further, deflection of the glass substrate upon the formation of a semiconducting thin layer or heating of the substrate results in defocusing. Therefore, the substrate should be intimately contacted with the stage from the viewpoint of correcting the deflection.

SUMMARY OF THE INVENTION

Accordingly, it is an object of the invention to solve the above problems of the prior art and to provide an apparatus for modifying a semiconducting thin layer, which can apply a laser beam to only a desired region through the prevention of accidental shift between the stage and the substrate.

In order to attain the above object, according to the invention, an apparatus for modifying a semiconducting thin layer, comprises:

a hermetically sealed container comprising a substrate mount section for mounting thereon a substrate with an amorphous semiconducting thin layer formed thereon, and a window for introducing a laser beam;

laser beam irradiation means which is provided outside the hermetically sealed container and applies a laser beam through the window, for heat-melting the amorphous semiconducting thin layer;

holding means for fixing and holding the substrate on the substrate mount section; and pressure control means which regulates the flow rate of gas fed into the hermetically sealed container to control the pressure of the atmosphere within the hermetically sealed container at the time of irradiation with the laser beam at a value above a vapor pressure specified by the temperature of the heat-melted amorphous semiconducting thin layer.

The invention includes the following preferred embodiments.

Specifically, the holding means may be vacuum adsorption means.

The holding means may be electrostatic adsorption means.

The substrate may be a glass substrate, and the amorphous semiconducting thin layer may be a thin layer of amorphous silicon.

The apparatus may further comprise: means for introducing nitrogen or inert gas into the hermetically sealed container; and means for introducing oxygen gas into the hermetically sealed container.

The apparatus may be used in the production of a field-effect thin film transistor.

The field-effect thin film transistor may be used as a driving element for active matrix liquid crystal devices.

By virtue of the above construction, the invention can prevent accidental shift of the substrate, and can closely control the irradiation site. Therefore, the number of laser beam irradiation sites can be reduced, and the utilization efficiency of the laser beam can be enhanced. In particular, in the case where the stage has a coordinate system and the laser beam irradiation site is controlled based on this coordinate system, the effect of preventing accidental shift is large. Further, the substrate can remain fixed onto the stage even under conditions such that the glass substrate is deflected upon the formation of a semiconducting thin layer and heating of the substrate. Therefore, the correction of the deflection is possible. This can realize the prevention of defocusing of the laser beam.

BRIEF DESCRIPTION OF THE DRAWINGS

The invention will be explained in more detail in conjunction with the appended drawings, wherein:

FIG. 3 is a perspective view showing a preferred embodiment of the invention;

FIG. 6 is a timing chart showing main operations (1) and (2);

FIG. 12 is a flow chart showing a preferred embodiment (treatment with a laser beam) of the invention;

FIG. 15 is an explanatory view showing a conventional irradiation method in the case where the irradiation form of a laser beam is rectangular.

DESCRIPTION OF THE PREFERRED EMBODIMENTS

One preferred embodiment of the invention will be explained in conjunction with accompanying drawings.

In a laser crystallization process, the inclusion of metallic impurities other than the semiconductor material used should be prevented. As with other processes used in semiconductor device production processes, for example, CVD process, the laser crystallization process should utilize a vacuum container in which evacuation to a high vacuum level of more than 10 to 5 Torr (1 Torr=1/(7.50062×10$^{-3}$) Pa; the same shall apply hereinafter) is possible. In the CVD process, after the container is once evacuated to a high vacuum level, a raw material gas, a carrier gas and the like controlled to a level of about $10^{-4}$ to $10^{-1}$ Torr are introduced, and a reaction precursor is formed using heat or plasma as gas decomposition means to form a desired layer on the substrate. On the other hand, in the laser crystallization process, since there is no need to intentionally use any reactive gas, this process has been carried out in an atmosphere on a high vacuum level of more than $10^{-5}$ Torr, or in an inert gas atmosphere controlled to about $10^{-4}$ to $10^{-1}$ Torr. The use of the laser crystallization process in mass production, however, poses the following problem. Specifically, laser beam irradiation of a semiconductor material heats the semiconductor material and brings about a temperature rise of the semiconductor material, and semiconductor material atoms are vaporized, and are deposited on a laser introduction window. As a result, the laser beam transmission is lowered, and the irradiation intensity unfavorably changes with the time.

To overcome this problem, according to this preferred embodiment, setting the pressure of inert gas introduced into the chamber to a value around the atmospheric pressure can prevent the deposition of a semiconductor material onto a gas introduction window. Further, the substrate is fixed and held on the stage by means of predetermined holding means, because the accidental shift of the substrate on the stage is likely to occur due to the fact that the friction between the substrate and the stage is smaller than the case where the substrate is placed in a high-vacuum atmosphere. The use of high-pressure atmosphere around the atmospheric pressure enables the use of vacuum adsorption means (vacuum chuck or the like) as the holding means. It is a matter of course that the holding means is not limited to the vacuum adsorption means and may be other means, for example, electrostatic adsorption means.

A pressure around the vapor pressure of the semiconductor material is necessary as a measure of the atmosphere having a high pressure of the inert gas or the like around the atmospheric pressure. This is because the semiconductor material gas density is approximately at least halved on the surface of the semiconductor material, and is further lowered around the laser beam introduction window.

Figure 1:
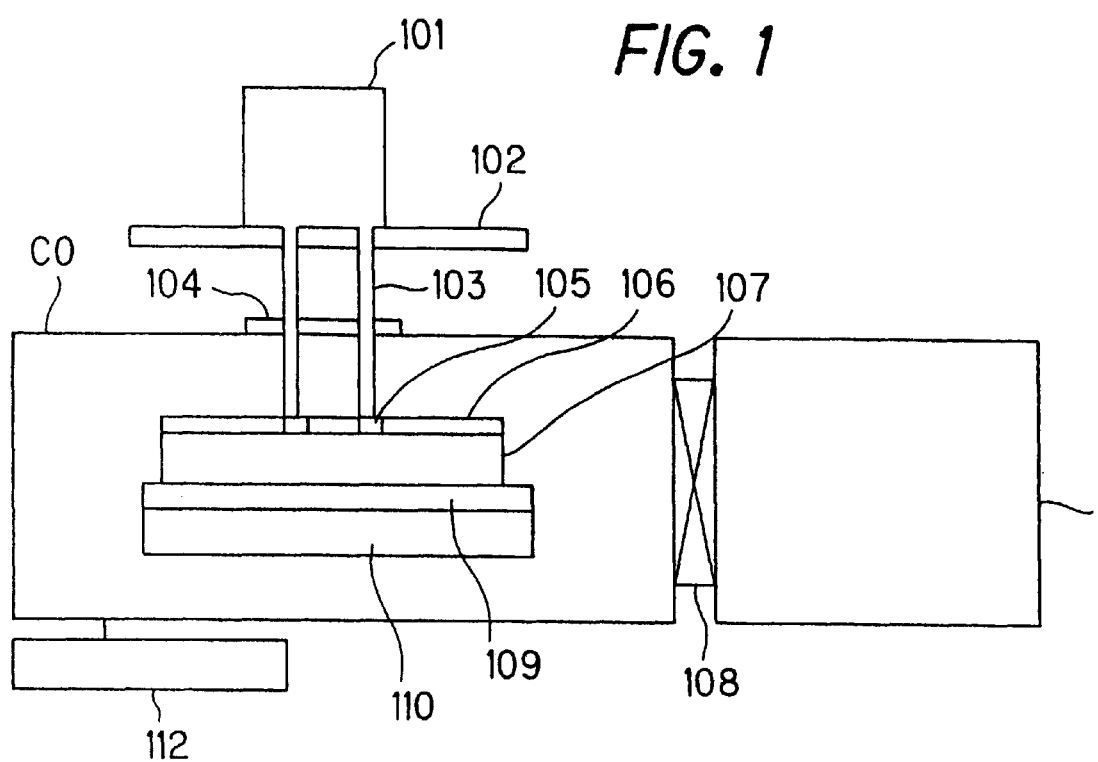
FIG. 1 is a cross-sectional view showing an apparatus according to a preferred embodiment of the invention.

FIG. 1 is a cross-sectional view showing an apparatus according to a preferred embodiment of the present invention. As shown in the drawing, a laser beam 101 fed from a laser beam source is passed through a group of optical devices, such as a beam homogenizer and mirrors, and is fed to a mask 102. The beam 103 passed through the mask 102 is brought to a desired beam form by an opening pattern formed in the mask 102, is passed through a projection lens (not shown) and a window 104, and is applied to the surface of a substrate 107. An amorphous semiconducting thin layer previously deposited on the substrate 107, that is, an unexposed region 106, is melted and recrystallized upon laser beam irradiation to be converted to an exposed region 105 as a crystalline thin layer. The substrate 107 is fixed and held on a stage 110 by holding means 109. In the vacuum container including the above apparatus, the pressure of the atmosphere is controlled by a pressure control device 112, and the vacuum container is connected through a gate valve 108 to a vacuum container 111 provided with substrate-carrying means. That is, the pressure control device 112 controls the pressure of atmosphere within the container at the time of laser beam irradiation so as not to be below the vapor pressure specified by the temperature of the semiconductor material which has been heat-melted by laser beam irradiation.

FIG. 2 is a cross-sectional view showing an apparatus according to a preferred embodiment of the invention. As shown in the drawing, the substrate 201 is moved and mounted by means of substrate-carrying means (not shown) on a pin of a mechanism 207 for vertically moving a substrate. The stage 202 is provided with a stage (guide section) 203 for roughly positioning the substrate 201 and a pin passage port 204. An adsorption port 205 provided for the fixation of a substrate is connected to an adsorption evacuation line 206. After the withdrawal of the substrate-carrying means, the mechanism for vertically moving a substrate is allowed to descend almost simultaneously with the closing of a gate valve for isolating the atmosphere and the introduction of gas to put the substrate 201 on the stage 202. At that time, an adsorption mechanism is operated to fix and hold the substrate 201 onto the stage 202.

FIG. 3 is a perspective view showing a preferred embodiment of the invention. Pulsed UV beams fed from a first excimer laser EL1 and a second excimer laser EL2 are passed through mirrors opt3, opt3' and lenses opt4 and are led to a homogenizer opt20'. In this case, the beam intensity profile is regulated so that a desired homogeneity, for example, an in-plane distribution ±5%, is achieved in an optical mask opt21. For the original beam fed from the excimer laser, since the intensity profile and the total energy are sometimes varied for each pulse, a mechanism is preferably provided which can further homogenize the intensity on the optical mask in terms of special distribution and pulse-to-pulse variation. A homogenizer using a fly-eye lens or a cylindrical lens is generally adopted as a homogenizer opt20'.

A beam pattern formed by the optical mask is passed through a demagnification projection exposure system opt23' and a laser beam introduction window W0 and is applied to a substrate sub0 provided within a vacuum chamber C0. The substrate sub0 is mounted on the substrate stage S0, and the movement of the substrate stage S0 (movement in direction X or Y in the drawing) enables a desired region, for example, a pattern transfer region ex0, to be exposed to a beam pattern.

In FIG. 3, a demagnification projection optical system is shown.

In some cases, an optical system for performing a magnification or enlargement projection may be used. Further, a method may be used wherein the optical mask is provided on a mask stage (not shown) and a laser beam is applied to the substrate at its desired site by moving the optical mask.

Next, an embodiment of a mechanism necessary for applying a desired beam pattern onto the substrate under desired conditions will be described. Since a fine control is necessary for the regulation of the optical axis, a method will be described wherein the optical axis, which has been regulated once, is fixed and, in this state, the position of the substrate is regulated. For the position of the substrate irradiation face relative to the optical axis, the position in focus (Z) direction and the vertical position relative to the optical axis should be corrected. Therefore, in the drawing, among θxy tilt correction direction, θxz tilt correction direction, θyz tilt correction direction, X exposure region movement direction, Y exposure region movement direction, and Z focusing direction, the vertical position relative to the optical axis is corrected by regulating the θxy tilt correction direction, the θxz tilt correction direction, and the θyz tilt correction direction. Further, the substrate irradiation face is disposed and controlled so as to be located at a position according to a focal depth of the optical system by regulating the Z focusing direction.

Figure 4:
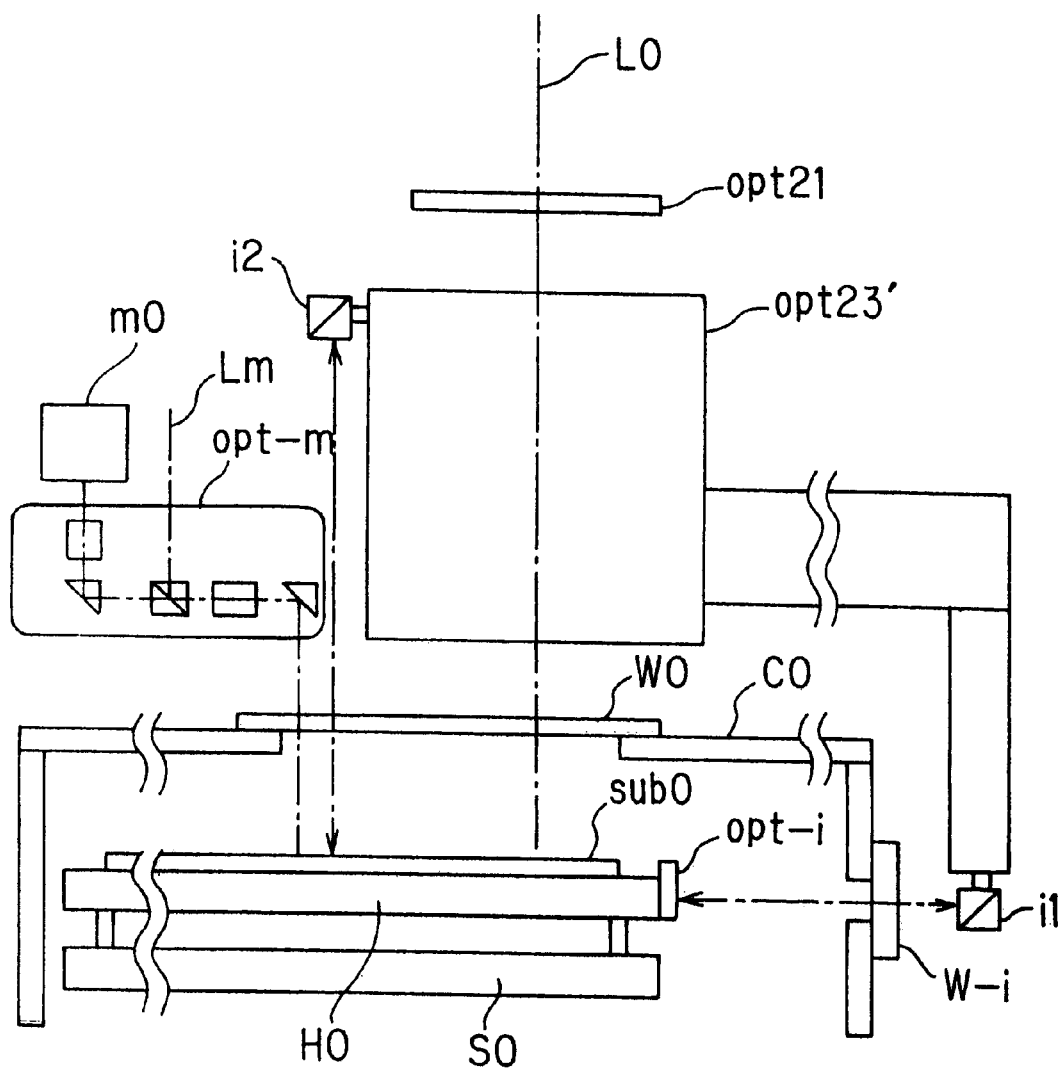
FIG. 4 is a side view of an alignment mechanism of a substrate.

FIG. 4 is a side view of a mechanism for the above regulation and the alignment of the substrate. An optical mask opt21, a demagnification projection exposure system opt23', and a laser introduction window W0 are disposed relative to an L0 exposure axis as shown in FIG. 4. A substrate sub0 disposed within a vacuum chamber C0 is disposed on a heater H0 provided with a substrate adsorption mechanism and a substrate XYZθxyθxzθyz stage S0'. Although a vacuum chamber is used, the actual laser beam irradiation is preferably carried out in an inert gas, hydrogen, oxygen, nitrogen or other atmosphere created by replacement after evacuation. The pressure of the atmosphere may also be a pressure around the atmospheric pressure. The use of the heater provided with a substrate adsorption mechanism permits a temperature of approximately room temperature to 400° C. to be selected as a condition for substrate heating at the time of laser beam irradiation. When the pressure of the atmosphere is brought to a pressure around the atmospheric pressure, the substrate can be adsorbed by the vacuum chuck function. Therefore, accidental shift can be prevented, for example, even in the case of the movement of the substrate stage within the chamber, and the substrate can remain fixed onto the substrate stage even in the case of the occurrence of some warpage or deflection of the loaded substrate. In addition, deviation of focal depth from the normal one due to the warpage or deflection of the substrate caused by heating can be minimized.

Laser interferometers i1, i2 perform the alignment of the substrate and the measurement of the position of the substrate in direction Z through a length measuring window W-i and a length measuring mirror opt-i. In the alignment, the alignment mark on the substrate may be measured using an off-axis microscope m0, a light source Lm for a microscope, and an element opt-m for a microscope, and the desired exposure position may be measured using information of substrate position by means of a laser interference system. In FIG. 2, an off-axis method is illustrated. A through-the-lens method or a through-the-mask method (known also as a reticle method) may be applied. Further, means may be adopted wherein a linear coordinate is determined from a plurality of measuring points by a least square method to equalize the measuring error caused in the measurement.

Figure 5A:
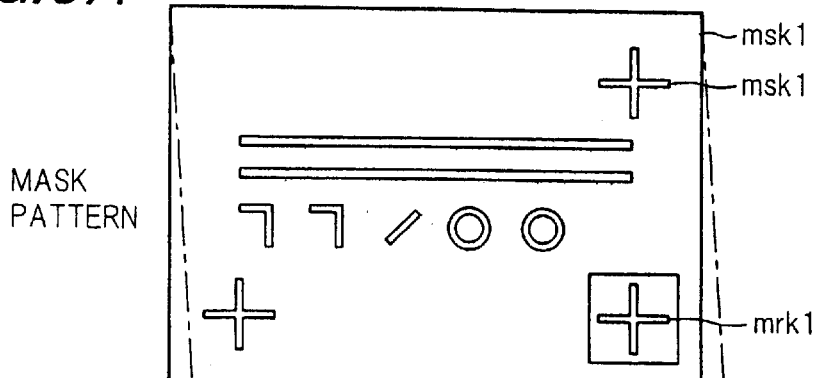
FIGS. 5A to 5C are explanatory views showing the relationship between a mask pattern and an alignment mark.
Figure 5B:
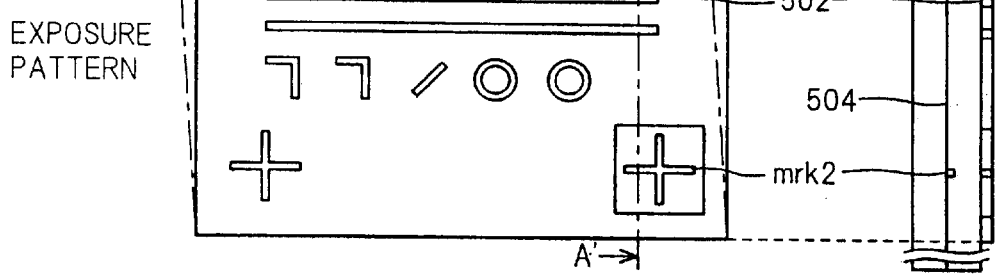
Figure 5C:
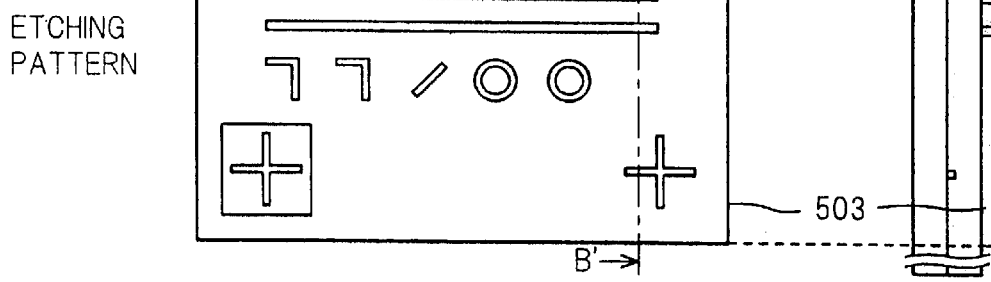

FIGS. 5A to 5C are explanatory views showing the relationship between a mask pattern and an alignment mark. The mask for use in exposure is composed of a mask msk1 (a portion not to be exposed) and a mask msk2 (a portion to be exposed). For example, when an excimer laser is used as a light source, a layer, which absorbs or reflects ultraviolet light, of a metal, such as aluminum, chromium, or tungsten, or a dielectric multilayer, is formed on a quartz substrate transparent to ultraviolet light, followed by the formation of a pattern by photolithography and etching. The silicon layer is exposed according to a desired pattern (as indicated by a white portion in FIG. 5A) on the mask, and an exposed silicon portion 502 is formed within the unexposed silicon portion 501 as shown in FIG. 5B. At that time, if necessary, alignment regulation is carried out in such a manner that the mark mrk1 on the mask is registered with the mark mrk2 on the substrate, followed by exposure. In this case, only the predetermined sites on the thin layer of silicon can be exposed.

In a thin film transistor formation process utilizing the above thin layer of silicon, for the first step wherein the exposure process requires positioning (that is, when no alignment mark is previously formed), exposure of the mark mrk3 simultaneously with the step of exposing the thin layer of silicon can form an alignment mark utilizing an optical color difference between a-Si and crystalline Si. Therefore, photolithography or the like in a post-step based on this mark can incorporate a transistor or desired mechanism or function into the exposed and modified desired region. After the step of exposure, an Si oxide layer is formed on the thin layer of silicon, and the silicon layer in its desired region is removed by etching. This state is shown in FIG. 5C. The Si removed portion 503 is a region from which the stacked silicon layer and Si oxide layer have been removed by etching. Silicon oxide layers 504, 505 are stacked on the nonexposed silicon portion 501 and the exposed silicon portion 502. Thus, an island structure of a silicon layer covered with the oxide layer can be built in to form a channel/source-drain region of a thin film transistor subjected to element separation and marks required for alignment in the subsequent step.

FIG. 6 are timing charts (1) and (2) showing main operations. In Control Example (1), the substrate is moved to a desired exposure position by operating the substrate stage. Next, focusing operation and alignment operation are carried out to precisely regulate the exposure position. At that time, for example, regulation is carried out so as to fall within a desired set error accuracy range (for example, about 0.1 to 100 μm). At the time when this operation has been completed, light is applied to the substrate. When a series of these operations have been completed, the substrate is moved to a next exposure region. Upon the completion of irradiation of necessary sites on the substrate, the substrate is replaced, followed by a predetermined series of treatments on a second substrate to be treated.

In Control Example (2), the substrate is moved to a desired exposure position by operating the substrate stage. Next, focusing operation and alignment operation are carried out to precisely regulate the exposure position. At that time, for example, regulation is carried out so as to fall within a desired set error accuracy range (for example, about 0.1 to 100 μm). At the time when this operation has been completed, the operation of the mask stage is started. In order to avoid a variation in moving step level at the time of start, the application of a laser beam to the substrate is started later than the start of the operation of the mask stage. It is a matter of course that, since the laser beam is applied to a point distant from the alignment position due to the movement of the stage, the offset level caused by this should be previously taken into consideration. A method may be adopted wherein, when the operation of a light source is started earlier than the application of light to the substrate and the stability of the output intensity of the light source has been enhanced, the shutter or the like is opened to perform the application of light to the substrate. In particular, it is known that, when a method is used wherein an excimer laser is used as the light source and the oscillation and stop periods are repeated, several tens of pulses in the initial stage are particularly unstable. When avoiding the application of these unstable laser pulses is contemplated, a method may be adopted wherein the beam is cut off according to the operation of the mask stage. When a series of these operations have been completed, the substrate is moved to a next exposure region. Upon the completion of irradiation of necessary sites on the substrate, the substrate is replaced, followed by a predetermined series of treatments on a second substrate to be treated.

Figure 7:
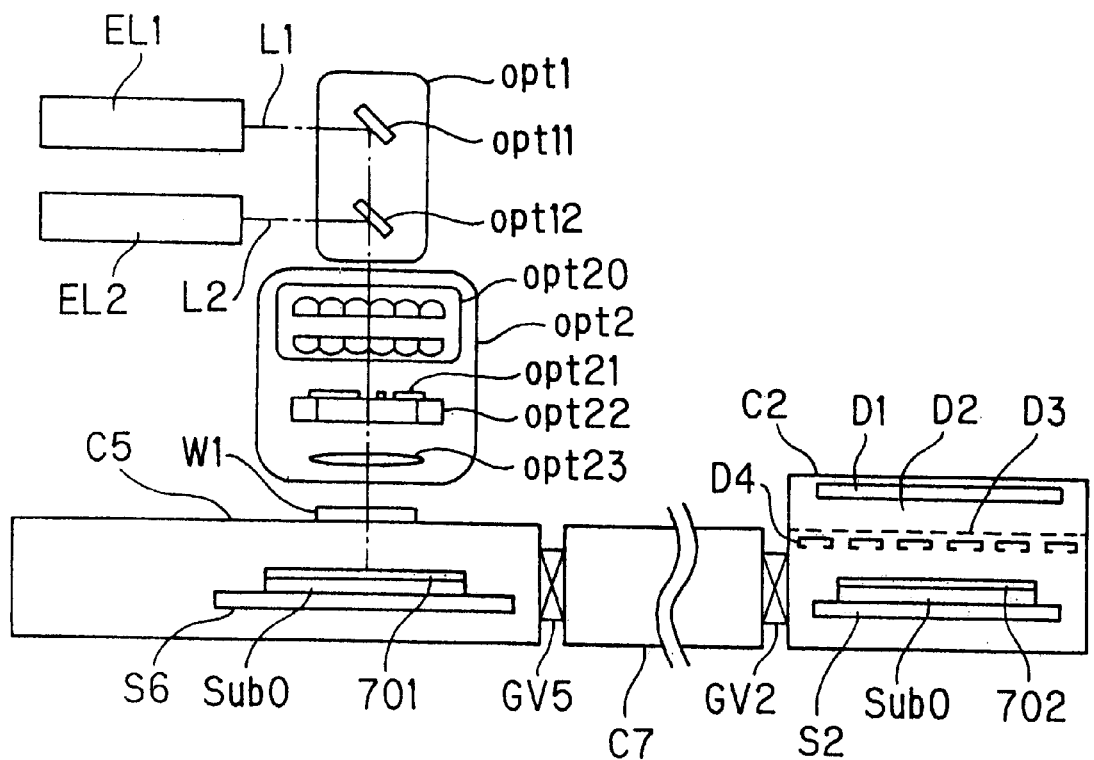
FIG. 7 is a side view showing a preferred embodiment (an apparatus for modifying a semiconducting thin layer) of the invention.

FIG. 7 is a side view showing a preferred embodiment (an apparatus for modifying a semiconducting thin layer) of the invention. This apparatus for modifying a semiconducting thin layer comprises a plasma CVD chamber C2, a laser irradiation chamber C5, and a substrate-carrying chamber C7. According to this preferred embodiment, the substrate may be carried in vacuo or an inert gas, nitrogen, hydrogen, oxygen or other atmosphere and under high vacuum, reduced pressure, or applied pressure through gate valves GV2, GV5 without contact with atmosphere in the outside of the apparatus. In the laser irradiation chamber, the substrate is provided through a chuck mechanism on a substrate stage S5 which can be heated to about 400° C. In the plasma CVD chamber, the substrate is provided on a substrate holder S2 which can be heated to about 400° C. In this embodiment, the state shown in the drawing is such that the glass substrate Sub0 with a thin layer 701 of silicon formed thereon is introduced into a laser irradiation chamber, and, upon laser beam irradiation, the thin layer of silicon on the surface is modified to a thin layer 702 of crystalline silicon, and is then carried to a plasma CVD chamber.

Regarding a laser beam introduced into the laser irradiation chamber, beams fed from a first excimer laser EL1 and a second excimer laser EL2 are passed through a first beam line L1 and a second beam line L2 and then through a laser synthesizing optical device opt1, a mirror opt11, a transmission mirror opt12, an optical device opt2 for laser irradiation, a homogenizer opt20, an optical mask opt21 fixed onto an optical mask stage opt22, an optical device opt23 for projection, and a laser beam introduction window W1, and then reaches the surface of the substrate. Here two excimer lasers are shown in the drawings. One or more desired light sources may be provided. The laser is not limited to the excimer laser, and may be pulsed laser, such as carbon dioxide laser or YAG laser. Further, the laser may be fed onto pulses through the utilization of a CW light source, such as argon laser, and a high-speed shutter.

On the other hand, in the plasma CVD chamber, a plasma formation region D2 is formed of an RF electrode D1 and a plasma confinement electrode D3 at a position distant from the region where the substrate is disposed. For example, oxygen and helium and silane gas using a starting gas introduction device D4 may be fed into the plasma formation region to form a silicon oxide layer on the substrate.

Figure 8:
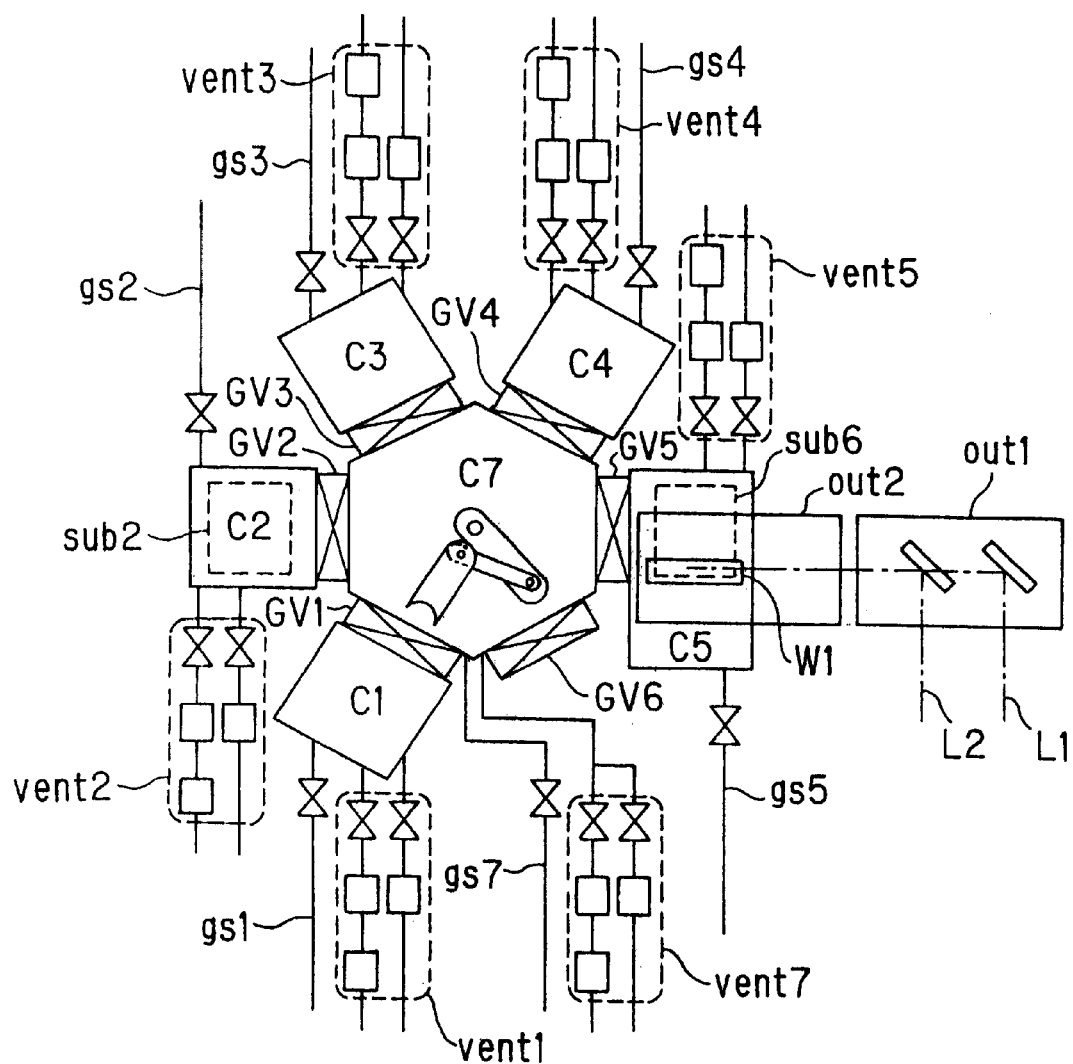
FIG. 8 is a top view showing a preferred embodiment (an apparatus for modifying a semiconducting thin layer) of the invention.

FIG. 8 is a top view showing a preferred embodiment (an apparatus for modifying a semiconducting thin layer) of the invention. A load/unload chamber C1, a plasma CVD chamber C2, a substrate heating chamber C3, a hydrogen plasma treatment chamber C4, a laser irradiation chamber C5, and a substrate-carrying chamber C7 are connected to one another through gate valves GV1 to GV6. Laser beams fed from a first beam line L1 and a second beam line L2 are passed through a laser synthesizing optical device opt1, a laser beam irradiation optical device opt2, and a laser beam introduction window W1 and are applied to the surface of the substrate. In the process chambers and the carrying chambers, gas introduction devices gs1 to ga7 and evacuation devices vent1 to vent7 are connected, and the feed of desired gas species, the setting of process pressure, and the regulation of evacuation and vacuum are carried out. As indicated by a dotted line within the drawing, the substrates sub2, sub6 to be treated are disposed on a plane.

Figure 9:
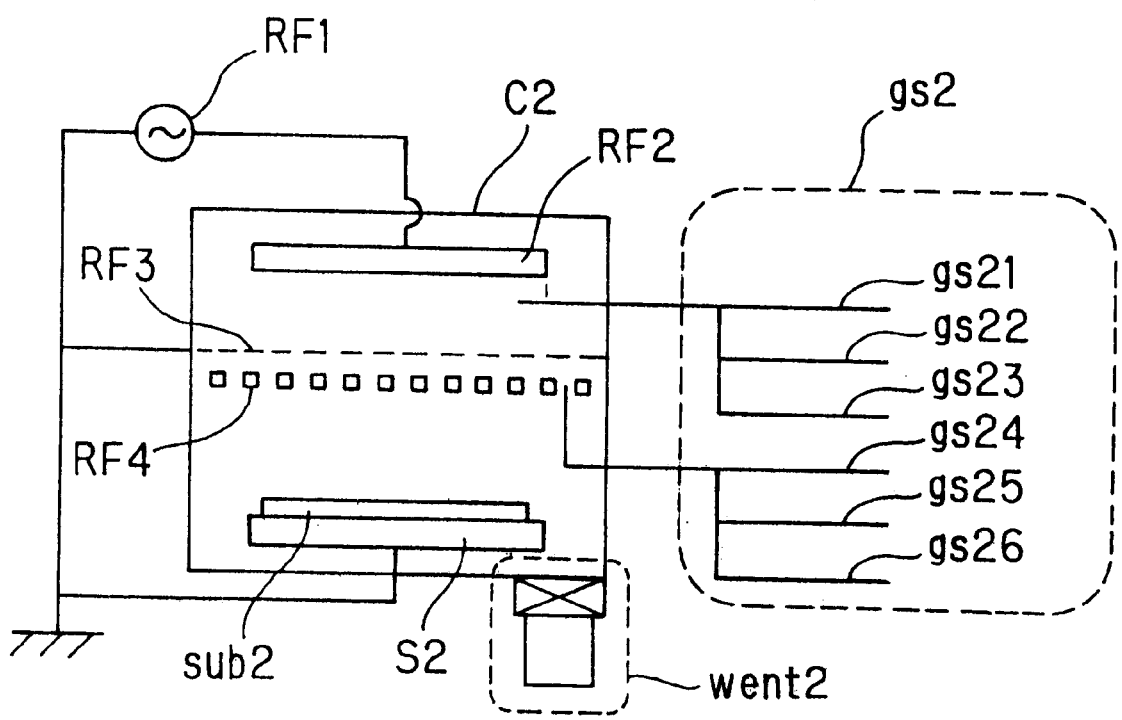
FIG. 9 is a schematic side view of a plasma CVD chamber C2 shown in FIG. 8.

FIG. 9 is a schematic side view showing the plasma CVD chamber C2 shown in FIG. 8. Power is fed from a high frequency power source RF1 (a high frequency of 13.56 MHz or higher being suitable) to a high frequency electrode RF2. Plasma is formed between an electrode RF3 provided with a gas feed hole and a high frequency electrode. Radicals formed by the reaction are passed through the electrode provided with a gas feed hole, and are led to a region where the substrate is disposed. A flat-type gas introduction device RF4 enables different gas to be introduced without exposure to plasma, and a thin layer is formed on a substrate sub2 through a gaseous phase reaction.

A substrate holder S2 is designed so as to perform heating, for example, by means of a heater, from room temperature to about 500° C. As shown in FIG. 9, the use of an evacuation device vent2, a gas introduction device gs2, an oxygen line gs21, a helium line gs22, a hydrogen line gs23, a silane line gs24, a helium line gs25, and an argon line gs26 permit oxygen radicals to be reacted with silane gas to form a silicon oxide layer. The formation of a layer under conditions of substrate temperature 300° C., pressure 0.1 Torr, RF power 100 W, flow rate of silane 10 sccm, flow rate of oxygen 400 sccm, and flow rate of helium 400 sccm has revealed that a silicon oxide layer having good properties, that is, a charge density of a fixed oxide layer ($5 \times 10^{11}$ cm$^{-2}$), is formed.

Further, increasing the ratio of the flow rate of oxygen to silane results in the formation of a better oxide layer. The form of the plasma CVD chamber is not limited to the above-described plain parallel plate RF plasma CVD device, and it is also possible to use methods not utilizing plasma, such as vacuum CVD or atmospheric CVD, and plasma CVD utilizing microwave or ECR (electron cyclotron resonance) effect.

When a plasma CVD device shown in FIG. 9 is used in the formation of a thin layer other than the silicon oxide layer, the following starting materials may be used as necessary gas species. Specifically, in the formation of an $Si_3N_4$ (silicon nitride) layer, $N_2$ (nitrogen) (or ammonia) (Ar (argon) as a carrier gas), $SiH_4$ (silane) (argon as carrier gas) and the like may be used. In the formation of a thin layer of Si (silicon), starting gases, such as a combination of $H_2$ (hydrogen) and silane, or a combination of hydrogen (argon as carrier gas) and $SiF_4$ (tetrafluorosilane) (argon as carrier gas), may be used. Further, hydrogen plasma treatment of a thin layer of silicon or a silicon oxide layer utilizing hydrogen plasma is also possible although this is not a film formation process.

Figure 10:
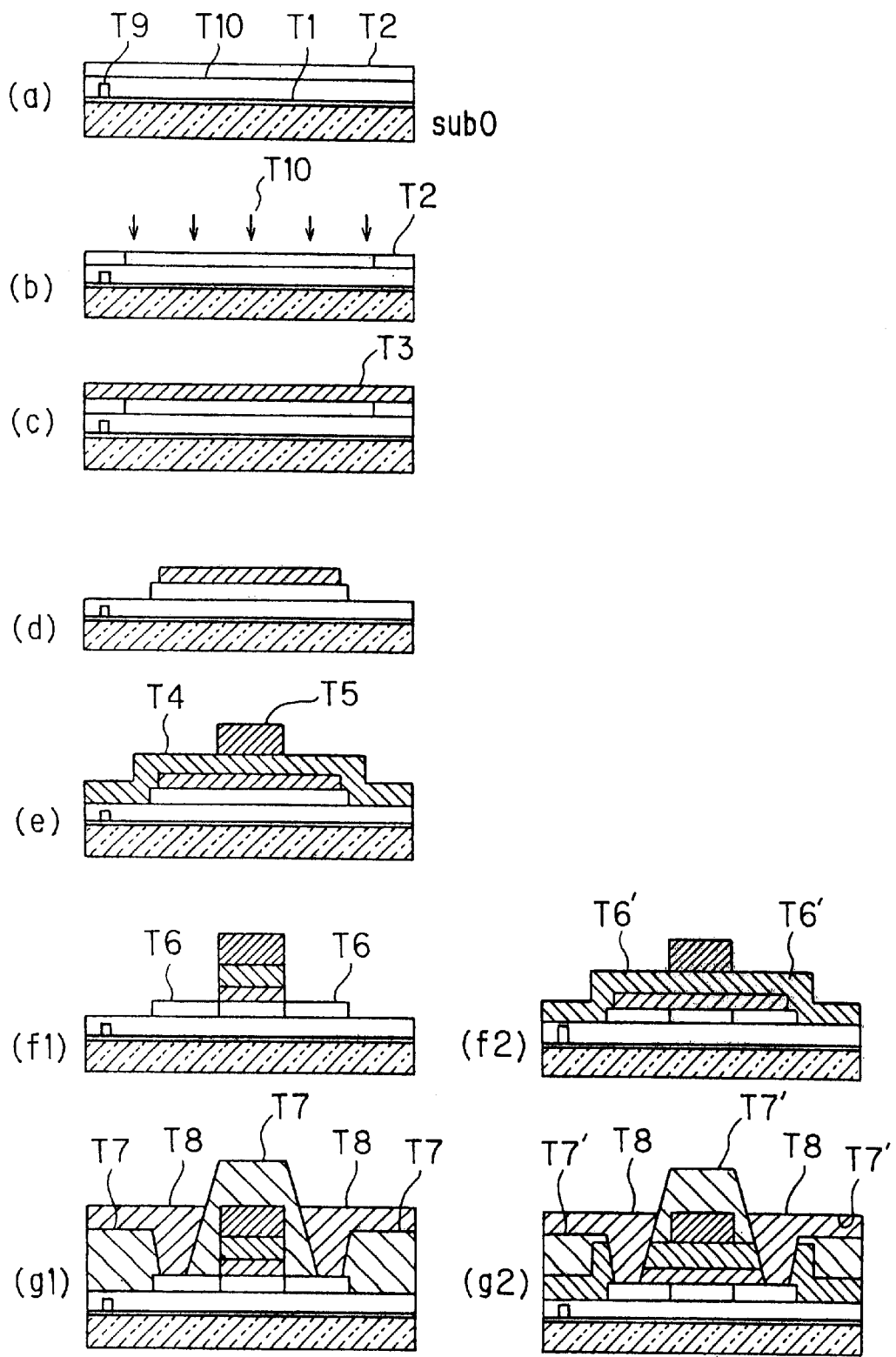
FIG. 10 is a cross-sectional view showing a production process of TFT.

FIG. 10 is a cross-sectional view showing a production process of TFT. An embodiment will be explained wherein an alignment mark is previously provided and laser beam irradiation is carried out according to the alignment mark. (a) A substrate cover layer T1 and a thin layer T2 of silicon are formed in that order on a glass substrate sub0 from which organic matter, metals, fine particles and the like have been removed by washing. In the formation of the substrate cover layer T1, a 1 μm-thick silicon oxide layer is formed at 450° C. from silane and oxygen gas as starting materials by LPCVD (low pressure chemical vapor deposition). The use of LPCVD permits the removal of the substrate holding region and the provision of a cover over the whole outer surface of the substrate (not shown). Alternatively, it is possible to use, for example, plasma CVD using TEOS (tetraethoxysilane) and oxygen as starting materials, atmospheric CVD using TEOS and ozone as starting materials, and plasma CVD as shown in FIG. 8. A material useful as the substrate cover layer is one which can prevent impurities harmful to semiconductor devices, contained in the substrate material (such as glass with alkaline metal concentration being minimized, or surface polished quartz or glass), from being diffused.

A 75 nm-thick thin layer of silicon is formed using $Si_2H_6$ (disilane) gas as a starting material by LPCVD at 500° C. In this case, since the concentration of hydrogen atom contained in the layer is not more than 1 atom %, it is possible to prevent, for example, layer roughening caused by the evolution of hydrogen in the step of laser beam irradiation. Alternatively, a thin layer of silicon having low hydrogen atom concentration may be formed by plasma CVD as shown in FIG. 7 or widely spread plasma CVD while regulating the substrate temperature, the flow rate ratio of hydrogen to saline, the flow rate ratio of hydrogen to tetrafluorosilane and the like. Patterning is performed by photolithography and etching to form an alignment mark T9 on the substrate. Next, a mark protective layer T10 is formed for protecting the alignment mark T9, followed by the formation of a thin layer T2 of silicon.

(b) The substrate provided in the step (a) is passed through the step of washing for removing organic matter, metals, fine particles, surface oxide layer and the like, and is then introduced into the apparatus for forming a thin layer according to the invention. A laser beam L1 is applied to modify the thin layer T2 of silicon in its desired region to a thin layer T2' of crystallized silicon. The laser crystallization is carried out in an atmosphere of nitrogen having a high purity of not less than 99.9999% at a pressure of not less than 700 Torr. Upon the completion of laser beam irradiation, oxygen gas is introduced. At the time of exposure to the laser beam, the substrate is fixed onto the substrate stage by adsorption, and the substrate in its desired region is exposed according to the alignment mark. Thereafter, alignment in the next step may be carried out according to a previously provided alignment mark and an alignment mark formed by patterning the thin layer of crystallized silicon (not shown).

(c) After the discharge of gas, the substrate which has been subjected to the above steps is passed through a substrate-carrying chamber, and is then carried to a plasma CVD chamber. A 10 nm-thick silicon oxide layer is deposited as a first gate insulation layer T3 at a substrate temperature of 350° C. from silane, helium, and oxygen as starting gases. Thereafter, hydrogen plasma treatment and heat annealing are carried out according to need. Up to this stage, treatment is carried out by the apparatus for forming a thin layer according to the present preferred embodiment.

(d) Next, islands of a stacked layer of the thin layer of silicon and the silicon oxide layer are formed by photolithography and etching. At that time, etching conditions are preferably such that the etching rate of the silicon oxide layer is higher than the etching rate of the thin layer of silicon. As shown in FIG. 10, the formation of a pattern so as to have a stepped (or tapered) cross section can prevent gate leak, and can provide thin film transistors with high reliability.

(e) Next, after washing is carried out for removing organic matter, metals, fine particles and the like, a second gate insulation layer T4 is formed so as to cover the islands. In this case, a 30 nm-thick silicon oxide layer was formed at 450° C. by LPCVD using silane and oxygen gas as starting materials. It is also possible to use, for example, plasma CVD using TEOS (tetraethoxysilane) and oxygen gas as starting materials, atmospheric CVD using TEOS and ozone as starting materials, and plasma CVD as shown in FIG. 8.

Next, an 80 nm-thick $n^+$ silicon layer and a 110 nm-thick tungsten silicide layer are formed as gate electrodes. The $n^+$ silicon layer is preferably a crystalline phosphorus-doped silicon layer formed by plasma CVD or LPCVD. Thereafter, photolithography and etching are carried out to form a patterned gate electrode T5. Subsequently, any one of two steps (f1 or f2) described later may be used according to the structure of transistors to be produced.

(f1), (f2) Next, impurity introduction regions T6, T6' are formed using the gate as a mask. In the formation of a CMOS circuit, photolithography is used in combination to separately form n-channel TFT requiring n+region and p-channel TFT requiring P+region. Methods wherein mass separation of impurity ions to be implanted is not carried out, such as ion doping, ion implantation, plasma doping, and laser doping, may be adopted. At that time, according to applications or impurity introduction method, as shown in (f1), (f2), an impurity is introduced while leaving the silicon oxide layer on the surface or after removing the silicon oxide layer from the surface.

(g1), (g2) Interlayer separation-insulation layers T7, T7' are deposited, and contact holes are provided, followed by deposition of a metal and the formation of a metallic wiring T8 by photolithography and etching. A TEOS oxide layer, a silica-based coating, or an organic coating, which can be flattened, may be used as the interlayer separation-insulation layer. Contact holes may be formed by photolithography and etching. A metal having low electric resistance, such as aluminum, copper, or an alloy based on aluminum or copper, and a high-melting metal, such as tungsten or molybdenum, may be applied to the metallic wiring. Thin film transistors having high performance and high reliability can be formed through the above steps.

Figure 11A:
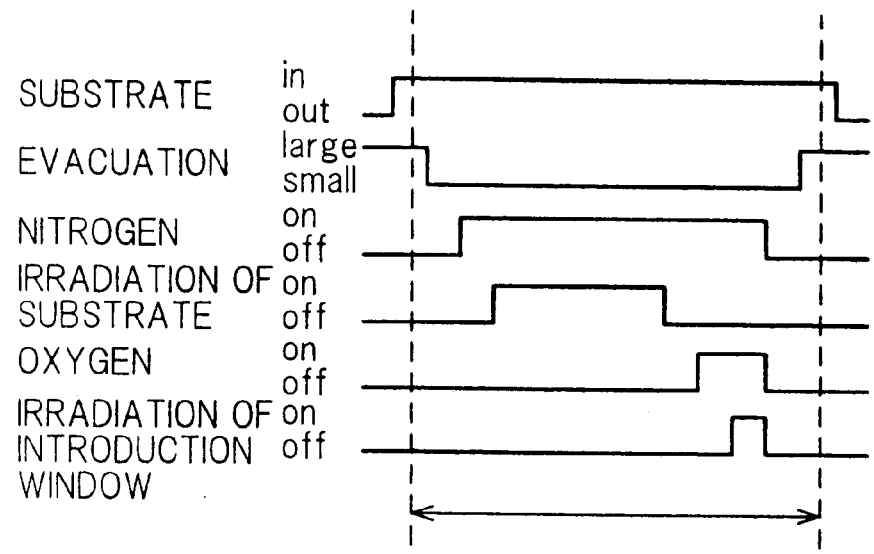
FIG. 11 is a timing chart showing a preferred embodiment of the invention.
Figure 11B:
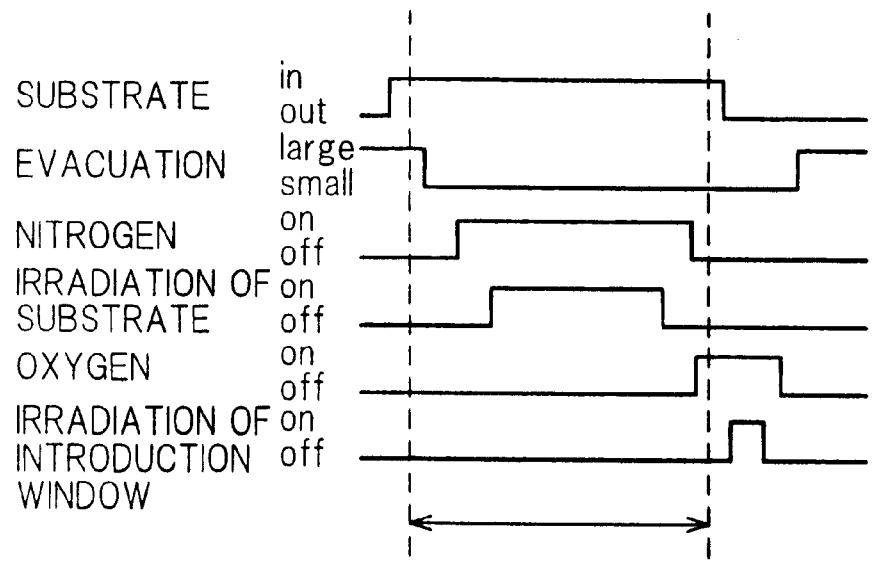

FIG. 11 is a timing chart showing a preferred embodiment of the invention.

Figure 13:
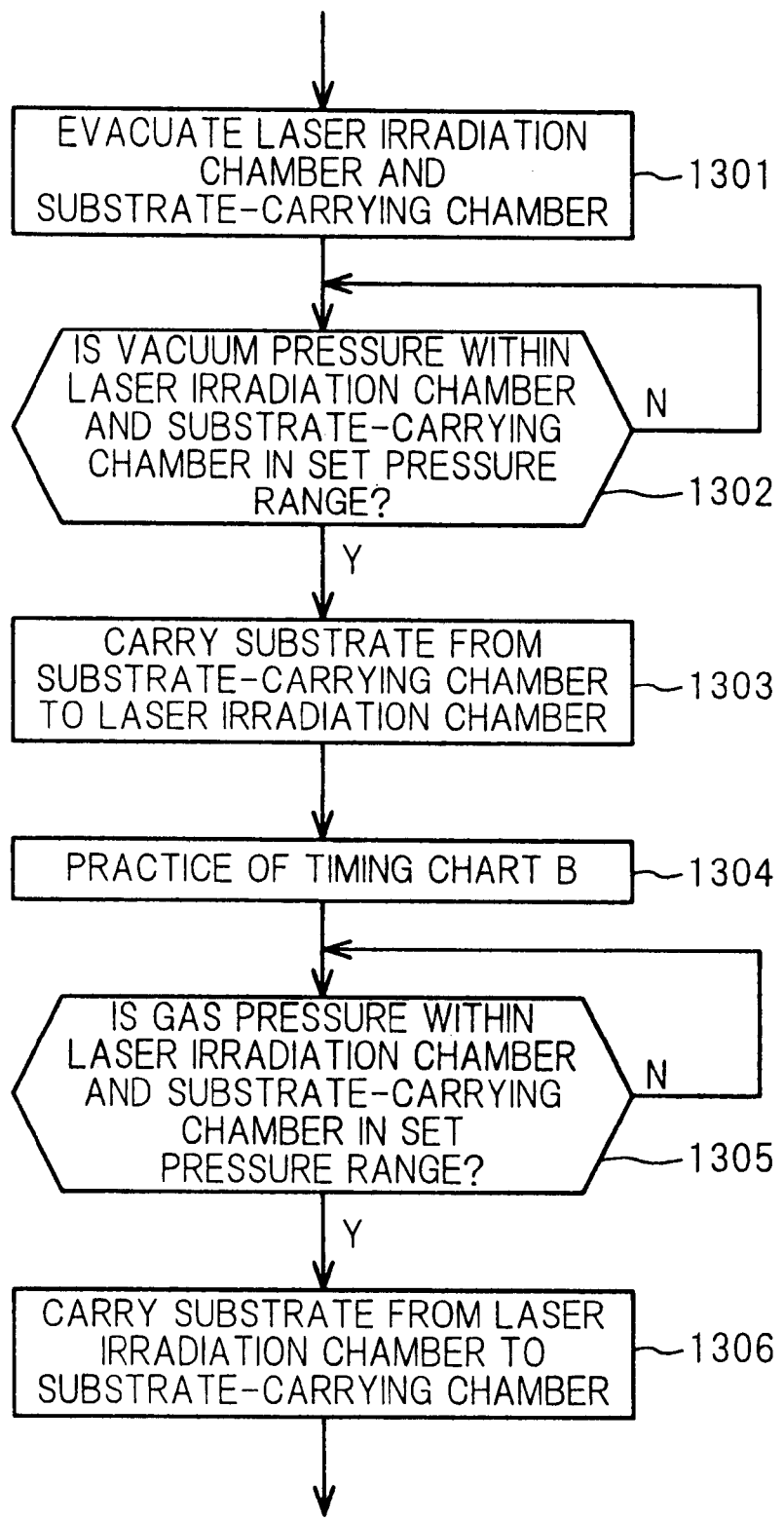
FIG. 13 is a flow chart showing a preferred embodiment (treatment with a laser beam) of the invention.

FIGS. 12 and 13 are flow charts showing laser treatment. As shown in FIGS. 11 (A) and 12, a substrate is introduced into a satisfactorily evacuated laser treatment chamber. A gate valve is closed, and a flow of gas into the substrate-carrying chamber (or other treatment chambers, such as load lock chamber and thin silicon layer formation chamber) is stopped. Nitrogen (or an inert gas, such as argon, hydrogen, or a mixed gas composed of the above gases) is then introduced. At that time, preferably, the pressure is controlled at a given nitrogen pressure without stopping the evacuation. It is also possible to close the gas introduction valve when the pressure has reached a certain pressure after the stop of evacuation or gas introduction (not shown). Here the substrate is fixed by adsorption. The stage with the substrate disposed thereon is moved to a predetermined position, and, if necessary, after the pressure or the temperature of a heater for the substrate is brought to a predetermined state (not shown), the irradiation of the substrate with a laser beam is started.

After desired regions are irradiated (recrystallized) with the laser beam by moving the substrate stage or the irradiation beam, oxygen is introduced. A laser beam is applied to a laser introduction window while preventing the laser beam from being applied to effective regions on the treated substrate, for example, through the utilization of the movement of the substrate stage or an optical shutter mechanism disposed within the vacuum device. The application of the laser beam to the introduction window, the feed of oxygen, and the feed of nitrogen are simultaneously or successively stopped, and the displacement is increased. The adsorption of the substrate is released, and the evacuation is carried out until the pressure of the laser irradiation chamber is brought to a predetermined range. The gate value connected to the substrate-carrying chamber is then opened to withdraw the substrate.

On the other hand, the following embodiment may also be used. As shown in FIGS. 11 (B) and 13, a substrate is introduced into a satisfactorily evacuated laser treatment chamber. A gate valve is closed, and a flow of gas into the substrate-carrying chamber (or other treatment chambers, such as load lock chamber and thin silicon layer formation chamber) is stopped. Nitrogen (or an inert gas, such as argon, hydrogen, or a mixed gas composed of the above gases) is then introduced. Here the substrate is fixed by adsorption. The stage with the substrate disposed thereon is moved to a predetermined position, and, if necessary, after the pressure or the temperature of a heater for the substrate is brought to a predetermined state (not shown), the irradiation of the substrate with a laser beam is started. After irradiation (recrystallization) of desired regions with the laser beam by moving the substrate stage or the irradiation beam, the feed of nitrogen is stopped, and oxygen is introduced. The substrate-carrying chamber is previously controlled to a predetermined pressure by an oxygen atmosphere, and, as soon as the pressure within the laser beam irradiation chamber reaches a predetermined pressure, the gate valve is opened to discharge the substrate. As soon as the carriage of the substrate has been completed, a laser beam is applied to a laser introduction window. The application of the laser beam to the introduction window, the feed of oxygen, and the feed of nitrogen are simultaneously or successively stopped, and the displacement is increased.

In the above preferred embodiments, for oxygen introduced or inert gas, nitrogen, hydrogen and the like constituting the mixed gas, high-purity gases fed from a gas purification device or a gas cylinder were used such that each of the gases, when viewed alone, had a purity of 99.9999%. The introduction of high-purity oxygen into a vacuum device immediately after the laser crystallization leads to the formation of an auto-oxidized layer having low impurity concentration on the surface, and this can prevent the adherence of impurities on the surface of silicon in the laser beam irradiation chamber, the substrate-carrying chamber, the film formation chamber and the like (the surface of the thin layer of silicon after the laser crystallization is in a very active state, and, even within a vacuum device, impurities are easily adhered onto the surface unless the atmosphere is closely controlled. In this case, the incorporation of impurities adhered, for example, to inner wall of the device can be advantageously reduced, although the efficiency in terms of single process is inferior to that in the case where active gas, such as radical or ion, is used. Consequently, a lowering in the rate of operation of the apparatus due to cleaning or maintenance within the apparatus can be prevented, and the overall production efficiency could be successfully enhanced. Further, since the amount of carbon present in the silicon oxide layer and in the interface of the silicon oxide layer could have been reduced, the use of the apparatus and production process according to the invention could have realized the production of thin film transistors having low leak current.

As is apparent from the foregoing description, the apparatus for modifying an amorphous semiconducting thin layer comprises: a hermetically sealed container comprising a substrate mount section for mounting thereon a substrate with an amorphous semiconducting thin layer formed thereon and a window for introducing a laser beam; laser beam irradiation means which is provided outside the hermetically sealed container and applies a laser beam through the light transmissive window, for heat-melting the amorphous semiconducting thin layer; holding means for fixing and holding the substrate on the substrate mount section; and pressure control means which regulates the flow rate of gas fed into the hermetically sealed container to control the pressure of the atmosphere within the hermetically sealed container at the time of irradiation with the laser beam at a value above a vapor pressure specified by the temperature of the heat-melted amorphous semiconducting thin layer.

By virtue of this construction, the misregistration of the substrate can be prevented, and the irradiation sites can be closely controlled. Therefore, the number of laser beam irradiation sites can be reduced, and the utilization efficiency of the laser beam can be enhanced. In particular, in the case where the stage has a coordinate system and the laser beam irradiation site is controlled based on this coordinate system, the effect of preventing accidental shift is large. Further, the substrate can remain fixed onto the stage even under conditions such that the glass substrate is deflected upon the formation of a semiconducting thin layer and heating of the substrate. Therefore, the correction of the deflection is possible. This can realize the prevention of defocusing of the laser beam.

The invention has been described in detail with particular reference to preferred embodiments, but it will be understood that variations and modifications can be effected within the scope of the invention as set forth in the appended claims.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

The following is a list of elements found in FIG. 1:

C0: VACUUM CHAMBER
101: LASER
102: MASK
103: BEAM PASSED THROUGH MASK
104: WINDOW
105: EXPOSURE AREA
106: UNEXPOSED AREA
107: SUBSTRATE
108: GATE VALVE
109: HOLDING MEANS
110: STAGE
111: VACUUM VESSEL PROVIDED WITH SUBSTRATE-CARRYING MEANS
112: PRESSURE CONTROL UNIT

Figure 2A:
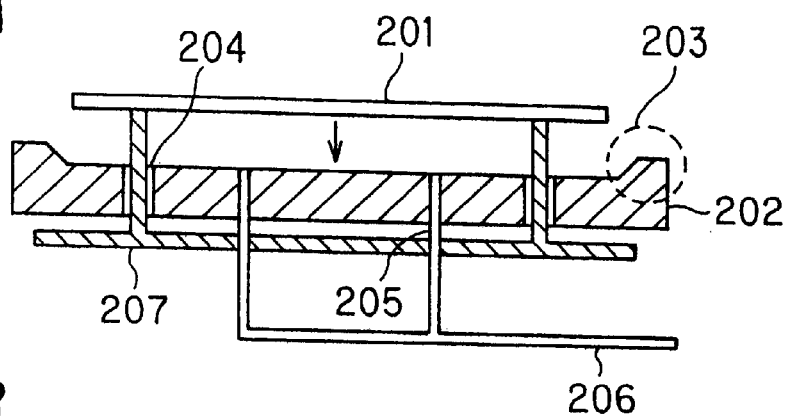
FIG. 2 is a cross-sectional view showing an apparatus according to a preferred embodiment of the invention.
Figure 2B:
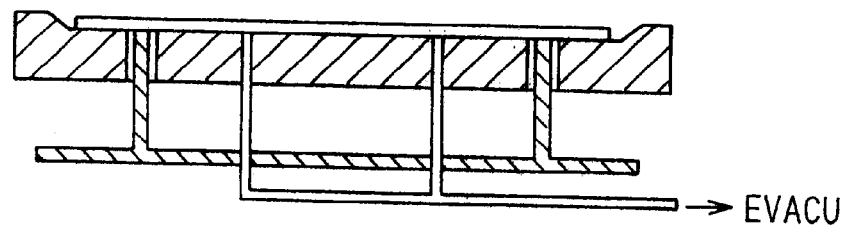

The following is a list of elements found in FIGS. 2A and 2B:

201: SUBSTRATE
202: STAGE
203: STAGE (GUIDE SECTION)

204: PIN PASSING PORT
205: ADSORPTION PORT
206: EVACUATION LINE FOR ADSORPTION
207: MECHANISM FOR VERTICALLY MOVING SUBSTRATE

Figure 14:
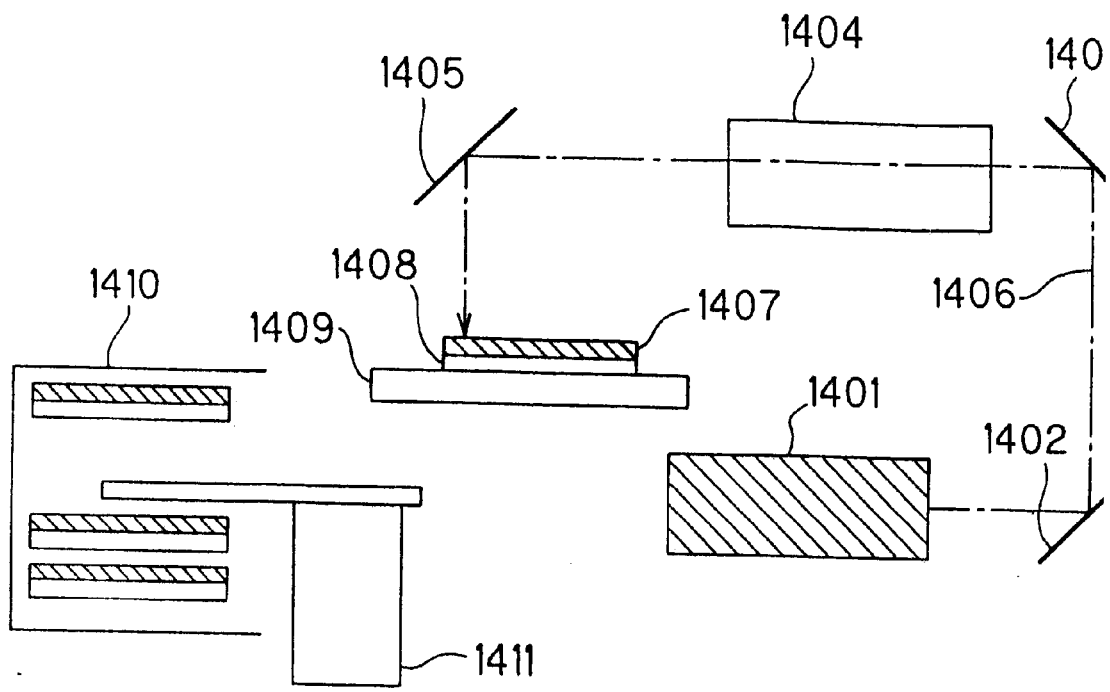
FIG. 14 is an explanatory view of a conventional ELA apparatus.

The following is a list of elements and symbols found in FIG. 3:

EL 1: FIRST EXCIMER LASER
EL 2: SECOND EXCIMER LASER
opt20': HOMOGENIZER
opt21: OPTICAL MASK
opt 23':DEMAGNIFICATION PROJECTION EXPOSURE SYSTEM
opt3, opt3':MIRRORS
opt4: LENS
W0: LASER INTRODUCTION WINDOW
C0: VACUUM CHAMBER
sub0: SUBSTRATE
S0: SUBSTRATE STAGE
ex0: PATTERN TRANSFER REGION
θxy: TILT CORRECTION DIRECTION
θxz: TILT CORRECTION DIRECTION
θyz: TILT CORRECTION DIRECTION
X: EXPOSURE REGION MOVEMENT DIRECTION
Y: EXPOSURE REGION MOVEMENT DIRECTION
Z: FOCUSING DIRECTION The following is a list of elements and symbols found in FIG. 4:

L0: EXPOSURE AXIS
opt21: OPTICAL MASK
opt 23':DEMAGNIFICATION PROJECTION EXPOSURE SYSTEM
W0: LASER INTRODUCTION WINDOW
C0: VACUUM CHAMBER
sub0: SUBSTRATE
H0: HEATER PROVIDED WITH SUBSTRATE ADSORPTION MECHANISM
S0': SUBSTRATE XYZθxyθxzθyz STAGE
i1, i2: LASER INTERFEROMETER
W-1: LENGTH MEASURING WINDOW
opt-i: LENGTH MEASURING MIRROR
m0: OFF-AXIS MICROSCOPE
Lm: LIGHT SOURCE FOR MICROSCOPE
opt-m: ELEMENT FOR MICROSCOPE
SUBSTRATE-CARRYING MEANS The following is a list of elements found in FIG. 5A, 5B, and 5C:

msk 1: MASK (PORTION NOT TO BE EXPOSED)
msk 2: MASK (PORTION TO BE EXPOSED)
mrk 1: MARK ON MASK
mrk 2: MARK ON SUBSTRATE
mrk 3: EXPOSURE FORMATION MARK
501: NON-EXPOSED Si
502: EXPOSED Si
503: Si-REMOVED PORTION
504, 505: Si OXIDE LAYER The following is a list of elements and symbols found in FIG. 7:

C2: PLASMA CVD CHAMBER
C5: LASER IRRADIATION CHAMBER
C7: SUBSTRATE-CARRYING CHAMBER
GV2, GV5: GATE VALVE
S2: SUBSTRATE HOLDER
S5: SUBSTRATE STAGE
Sub0: GLASS SUBSTRATE
701: THIN LAYER OF SILICON
702: THIN LAYER OF CRYSTALLINE SILICON
EL 1: FIRST EXCIMER LASER
EL 2: SECOND EXCIMER LASER
L1: FIRST BEAM LINE
L2: SECOND BEAM LINE
WI: LASER INTRODUCTION WINDOW
D1: RF ELECTRODE
D2: PLASMA FORMATION REGION
D3: PLASMA CONTAINMENT ELETRODE
D4: MATERIAL GAS INTRODUCTION DEVICE
opt1: LASER SYNTHESIZING OPTICAL DEVICE
opt11 MIRROR
opt12: TRANSMISSION MIRROR
opt2: OPTICAL DEVICE FOR LASER IRRADIATION
opt20: HOMOGENIZER
opt21: OPTICAL MASK
opt22: OPTICAL MASK STAGE
opt23: OPTICAL DEVICE FOR PROJECTION The following is a list of elements found in FIG. 8:

C1: LOAD/UNLOAD CHAMBER
C2: PLASMA CVD CHAMBER
C3: SUBSTRATE HEATING CHAMBER
C4: HYDROGEN PLASMA TREATMENT CHAMBER
C5: LASER IRRADIATION CHAMBER
C7: SUBSTRATE-CARRYING CHAMBER
GV1 TO GV6: GATE VALVE
W1: LASER INTRODUCTION WINDOW
L1: FIRST BEAM LINE
L2: SECOND BEAM LINE
opt1: LASER SYNTHESIZING OPTICAL DEVICE
opt2: OPTICAL DEVICE FOR LASER IRRADIATION
ga1 TO gs7: GAS INTRODUCTION DEVICE
vent1 TO vent7: EVACUATION DEVICE
sub2, sub6: TREATMENT SUBSTRATE The following is a list of elements found in FIG. 9:

C2: PLASMA CVD CHAMBER
RF1: HIGH-FREQUENCY POWER SOURCE
RF2: HIGH-FREQUENCY ELECTRODE
RF3: ELECTRODE WITH GAS FEED HOLE
RF4: FLAT-TYPE GAS INTRODUCTION DEVICE
sub2: SUBSTRATE
S2: SUBSTRATE HOLDER
vent2: EVACUATION DEVICE
gs2: GAS INTRODUCTION DEVICE
gs21: OXYGEN LINE
gs22: HELIUM LINE
gs23: HYDROGEN LINE
gs24: SILANE LINE
gs25: HELIUM LINE gs26: ARGON LINE The following is a list of elements and symbols found in FIG. 10:

sub0: GLASS SUBSTRATE
L10: LASER BEAM
T1: SUBSTRATE COVER LAYER
T2:, THIN LAYER OF SILICON
T2': THIN LAYER OF CRYSTALLIZED SILICON
T3: FIRST GATE INSULATING LAYER
T4: SECOND GATE INSULATING LAYER
T5: PATTERNED GATE ELECTRODE
T6,T6': IMPURITY IMPLANTATION REGION
T7,T7': LAYER SEPARATING/INSULATING LAYER
T8: METALLIC WIRING
T9: ALIGNMENT MARK
T10: MARK PROTECTIVE LAYER The following is a list of elements found in FIG. 14:

1401: LIGHT SOURCE FOR PULSE LASER
1402: MIRROR
1403: MIRROR
1404: BEAM HOMOGENIZER
1405: MIRROR
1406: OPTICAL PATH
1407: THIN LAYER OF SILICON
1408: GLASS SUBSTRATE
1409: X-Y STAGE
1410: GLASS SUBSTRATE-LOADED CASSETTE
1411: SUBSTRATE-CARRYING MECHANISM

The following is a list of elements and symbols found in FIG. 15A:

1501: GLASS SUBSTRATE
1502: IRRADIATION RANGE
1503: CRYSTALLIZATION REGION
1504: LASER INTRODUCTION WINDOW

What is claimed is:

1. An apparatus for transforming a semiconducting thin layer, comprising:

a hermetically sealed container comprising a substrate mount section for mounting thereon a substrate with a semiconducting thin layer formed thereon, and a light transmissive window for introducing a laser beam;

laser beam irradiation means which is provided outside the hermetically sealed container and applies a nonvibrating laser beam through the light transmissive window, for heat-melting the semiconducting thin layer;

holding means for fixing and holding the substrate on the substrate mount section; and pressure control means which regulate the flow rate of gas fed into the hermetically sealed container to control the pressure of the atmosphere within the hermetically sealed container at the time of irradiation with the laser beam at a value above a vapor pressure specified by the temperature of the heat-melted semiconducting thin layer.

2. The apparatus according to claim 1, wherein the holding means is vacuum adsorption means.

3. The apparatus according to claim 1, wherein the holding means is electrostatic adsorption means.

4. The apparatus according to claim 1, wherein the substrate is a glass substrate, and the semiconducting thin layer is a thin layer of amorphous silicon.

5. The apparatus according to claim 4, which further comprises:

means for introducing nitrogen or inert gas into the hermetically sealed container; and means for introducing oxygen gas into the hermetically sealed container.

6. The apparatus according to claim 1, which is used in the production of a field-effect thin film transistor.

7. The apparatus according to claim 6, wherein the field-effect thin film transistor is used as a driving element for active matrix liquid crystal devices.

* * * * *